United States Patent [19]
Reuhman-Huisken et al.

[11] Patent Number: 6,159,664
[45] Date of Patent: *Dec. 12, 2000

[54] METHOD OF MANUFACTURING A MATRIX FOR PRODUCING OPTICAL DISKS WITHOUT THE MEDIUM OF A MASTER

[75] Inventors: Maria Elizabeth Reuhman-Huisken, CD Eindhoven; Alex Thomas Van der Plaat, HR Eindhoven, both of Netherlands

[73] Assignee: ODME International B.V., Veldhoven, Netherlands

[ * ] Notice: This patent issued on a continued prosecution application filed under 37 CFR 1.53(d), and is subject to the twenty year patent term provisions of 35 U.S.C. 154(a)(2).

[21] Appl. No.: 08/680,110

[22] Filed: Jul. 15, 1996

Related U.S. Application Data

[63] Continuation of application No. 08/388,106, Feb. 13, 1995, abandoned.

[30] Foreign Application Priority Data

Feb. 14, 1994 [NL] Netherlands ............................ 9400225

[51] Int. Cl.$^7$ ....................................................... G03C 5/00
[52] U.S. Cl. .......................... 430/321; 430/320; 430/322; 430/324; 430/326; 430/327; 430/328; 430/329; 430/330; 430/945
[58] Field of Search ..................................... 430/321, 330, 430/324, 327, 328, 326, 322, 329, 945, 320

[56] References Cited

U.S. PATENT DOCUMENTS

| | | | |
|---|---|---|---|
| 3,832,176 | 8/1974 | Verstraete et al. | 430/324 |
| 4,164,754 | 8/1979 | Dubois | 358/128 |
| 4,650,735 | 3/1987 | De Laat | 430/16 |
| 4,724,043 | 2/1988 | Bergendahl et al. | 156/643 |
| 4,729,940 | 3/1988 | Nee et al. | 430/323 |
| 5,156,936 | 10/1992 | Beghin | 430/324 |
| 5,286,583 | 2/1994 | Hirokane et al. | 430/5 |
| 5,383,176 | 1/1995 | Inui et al. | 369/275.4 |
| 5,407,787 | 4/1995 | McElhanon et al. | 430/315 |

FOREIGN PATENT DOCUMENTS

| | | |
|---|---|---|
| 185097 | 6/1986 | European Pat. Off. . |
| 2701151 | 8/1994 | France . |

OTHER PUBLICATIONS

Patent Abstracts of Japan, JPA–60–045,956, vol. 9, No. 170 (P–373) (1893) Jul. 16, 1985.
Patent Abstracts of Japan, JPA–57–172,548, vol. 7, No. 19 (P–170) (1163) Jan. 25, 1983.
Patent Abstracts of Japan, JPA–60–251,537, vol. 10, No. 127 (P–455) (2184) May 13, 1986.
Bouwhuis et al., Principles of Optical Disc Systems, pp. 104–109, pp. 200–203.

*Primary Examiner*—Thorl Chea
*Attorney, Agent, or Firm*—Pillsbury Madison & Surto Intellectual Property Group, LLP

[57] ABSTRACT

The invention relates to a method of manufacturing a matrix for the production of optical disks by applying a photoresist film to an unstructured matrix plate and structuring the photoresist film by selectively exposing and developing said film. When a negatively acting photoresist is used, the matrix may be metal-plated on the surface provided with the photoresist film after structuring of the photoresist film. Structuring of the photoresist film may comprise heating of the selectively exposed photoresist film, integral exposure of the photoresist film prior to developing and heating of the photoresist film following developing. The unstructured matrix plate may be etched, using the structured photoresist film as a mask, after which the photoresist film is removed to produce the matrix. Prior to applying the photoresist film to the unstructured matrix plate a metal film may be applied, to a thickness equal to the height of the structure desired in the matrix. When a positively acting photoresist is used, a metal film is applied to the unstructured matrix plate, using the structured photoresist film as a mask, after which the photoresist film is removed to produce the matrix. A filling process may be used thereby.

28 Claims, 3 Drawing Sheets

PREPARING

APPLYING A POSITIVELY ACTING PHOTORESIST

DRYING

SELECTIVELY EXPOSING

DEVELOPING

SELECTIVELY APPLYING A METAL (FILLING)

REMOVING THE PHOTORESIST

METHOD OF MANUFACTURING A MATRIX FOR PRODUCING OPTICAL DISKS WITHOUT THE MEDIUM OF A MASTER

This is a continuation of application Ser. No. 08/388,106 filed on Feb. 13, 1995, now abandoned, which was abandoned upon the filing hereof.

BACKGROUND OF THE INVENTION

1. Field of the Invention

A method of manufacturing a matrix for producing optical disks without the medium of a master.

2. Background in the Art

The invention relates to a method of manufacturing a matrix for producing optical disks, whereby a photoresist film is applied to an unstructured matrix plate, and the photoresist film applied is structured, and whereby said structuring of the photoresist film applied successively comprises the steps of selectively exposing and developing the photoresist film applied.

A method of this kind is known from the publication: G. Bouwhuis, editor, "Principles of optical disk systems", Adam Hilger Ltd., Bristol 1985, which describes the conventional method of mass-producing optical disks, also called replicas. The method makes use of an injection moulding process and matrices which are manufactured through the medium of a master; that is, first a master is made and then a matrix by means of the master.

Optical disks contain information recorded in a geometric structure. More in particular this geometric structure consists of pits and lands, said pits being provided in concentric circles or in a spiral in a surface of a respective optical disk. Also grooves are sometimes used to form the structure of optical disks. Generally this. concerns media capable of being written on, such as CD-Recordable and magneto-optical disks. The known method of mass-producing optical disks of this type can be subdivided into three stages.

During the first stage information stored on an information carrier, in particular a magnetic tape, is converted into a sequence of electrical pulses. These pulses control the intensity of an exposing unit, in which a substrate plate, for example of glass, provided with a photoresist rotates. Thus small areas in the photoresist are exposed, which are dissolved in an aqueous basic solution in a next step.

The result is a structure of pits, as is also desired for the eventual optical disk. This intermediate product is called a master.

During the second stage one surface of the master is plated with a thin metal film. This metal film serves as an electrode for galvanically growing a relatively thick metal film, in particular nickel.

After physically separating the substrate plate and the thick metal film the information structure mentioned above is present on a surface of the thick metal film in inverted position. Then the thick metal film or sheet or shell is cleared of any residual photoresist, cut to size and used as a so-called matrix during the third stage yet be described hereafter. The steps carried out during the first and second stages may also be executed in a fully automated system, such as the applicant's AMS 100.

During the third and final stage the matrix is placed in the mould of an injection moulding machine, by means of which large series of optical disks, such as audio and/or video disks are produced. Finally the optical disks are metallized and provided with a protective coating and a label or a print. The third stage is a fully automatic production process.

The above-described known method is used worldwide, whereby use is made of a positively acting photoresist, whose main characteristic is the fact that the exposed areas of an exposed film of said positively acting photoresist are removed by developing, while those areas that have not been exposed remain intact.

The drawbacks of said galvanic growing process during the second stage discussed above are that a great deal of manual operations have to be performed and that a relatively great amount of chemicals must be used. Although said operations are carried out by a handling unit in an automated process, the required very high complexity of this unit may lead to high costs and reliability problems. The electroplating time cycle is typically about 1 hour, which is long.

Although it is possible, by a so-called "family making" process, to make more than one matrix per master, by using a matrix itself as an information carrier and making use of a galvanic process, this method is being applied less and less in the industry, precisely because of the above-mentioned drawbacks. Also smaller batches of disks, such as for CD-ROM disks, have contributed towards ending the practice of making a "family".

SUMMARY OF THE INVENTION

The object of the invention is to alleviate or overcome the drawbacks of the known method referred to above, as a result of which the time cycle will be shortened, the number of errors will be reduced, output will increase and the use of chemicals can be pushed back, and to reduce the capital outlay for purchasing the complete production equipment.

In accordance with the invention a method of the kind referred to in the preamble is proposed to accomplish that objective, which is characterized in that a negatively acting photoresist is used to apply the photoresist film to the unstructured matrix plate.

To the same end a method of the kind referred to in the preamble is proposed in accordance with the invention, whereby a positively acting photoresist is used to apply the photoresist film to the unstructured matrix plate, a metal film is applied to the unstructured matrix plate, using the structured photoresist film applied to the unstructured matrix plate as a mask, after which the structured photoresist film is removed to produce the matrix, characterized in that said metal film is applied to only the unstructured matrix plate in a thickness smaller than that of the structured photoresist film.

At least for the time being negatively acting photoresists seem to produce better results, so that these are to be preferred as yet.

BRIEF DESCRIPTION OF THE DRAWINGS

The invention will be explained in more detail hereafter with reference to the drawing, in which.

DETAILED DESCRIPTION OF THE DRAWINGS

Figure 1:
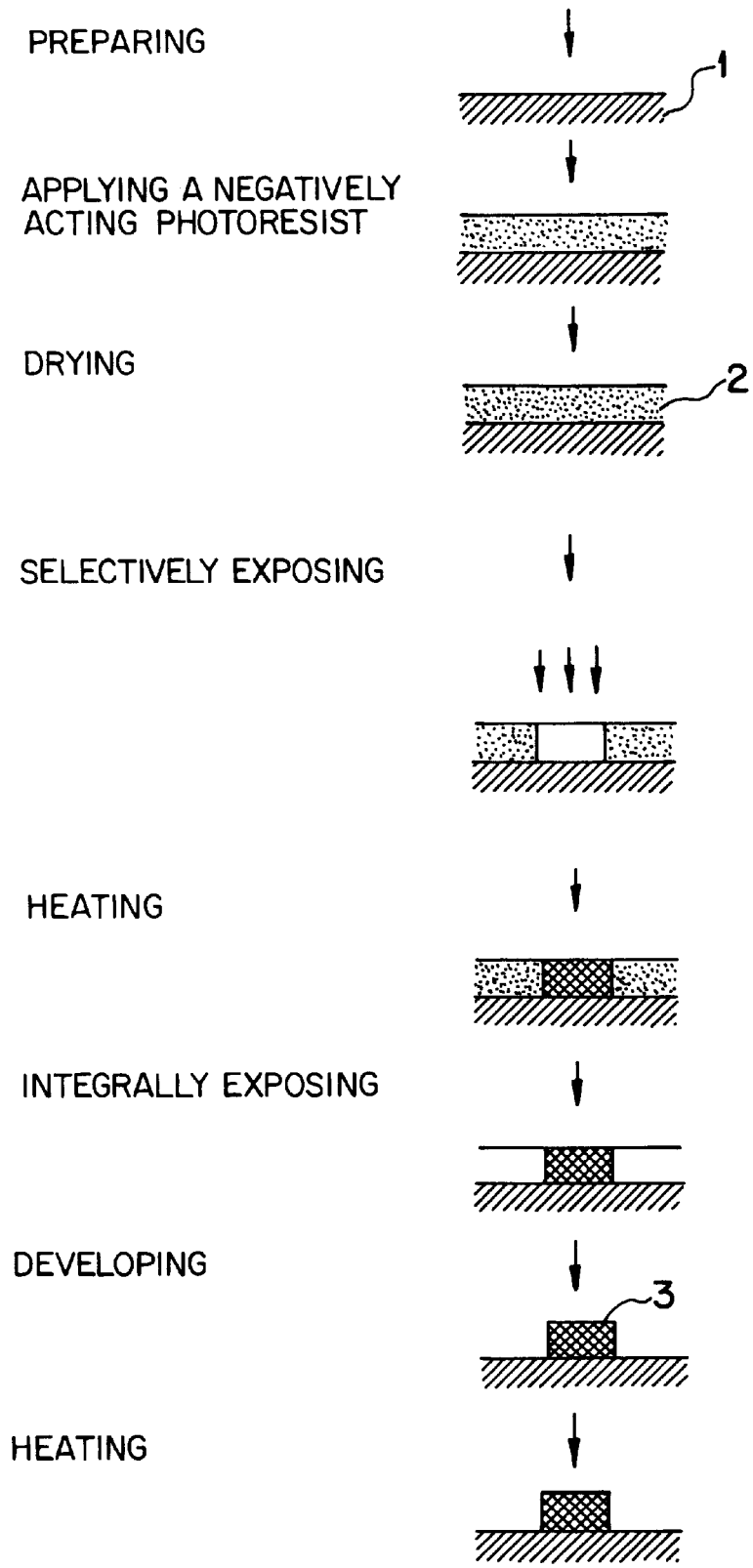
FIG. 1 schematically shows an embodiment of the proposed method, wherein a negatively acting photoresist is used.

In FIG. 1 a negatively acting photoresist is used. Exposed areas of a film of a negatively acting photoresist remain after developing, whilst areas that have not been exposed are removed by developing. When a negatively acting photoresist film is according to the invention applied to an unstructured matrix plate, which might in principle be placed directly in the injection moulding machine, and said photoresist film is structured, it becomes possible to leave out the metallization step as well as the electroplating step. If necessary or advantageous a few new steps for structuring and stabilizing the negatively acting photoresist film are introduced instead. As will be explained hereafter, said new steps are short and simple process steps, wherein no chemicals are used.

The term "unstructured matrix plate" also comprises unstructured matrix plates having a groove or grooves such as so-called pregrooves for tracking purposes.

Figure 2:
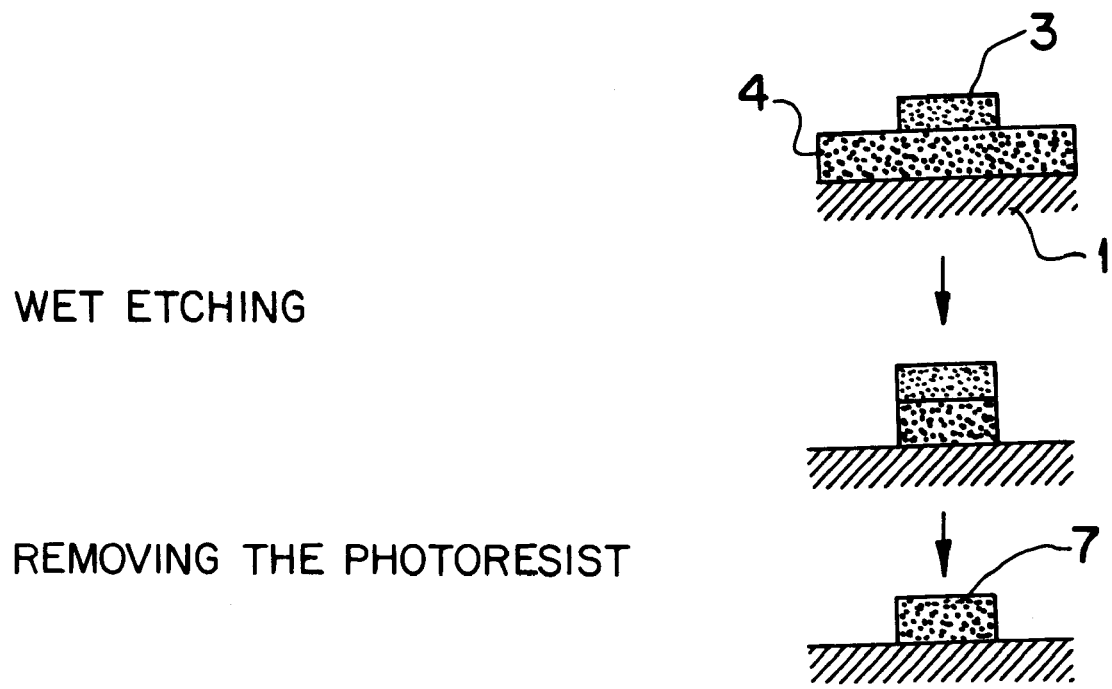
FIG. 2 schematically shows a variant of the method of FIG. 1.

In accordance with the variant of FIG. 2 a negatively acting photoresist is likewise used, but two further steps are added. The structured negatively acting photoresist film is thereby used as an etching mask for structuring the unstructured matrix plate, after which the negatively acting photoresist film is removed. Although wet processes are reintroduced with this variant, the stability of the geometric structure of the working surface of the matrix might be better, which may be advantageous when larger batches of optical disks are to be produced. This variant will be shorter and cheaper than the known method, however. An in-line process remains possible thereby. Furthermore a material to be etched may be applied to the unstructured matrix plate, in a thickness equal to that of the eventual structure.

In FIG. 1 the unstructured matrix plate is indicated at 1, the applied photoresist film is indicated at 2, and the structured photoresist film is indicated by reference numeral 3. As is furthermore indicated in FIG. 1, the successive steps may be the following: preparing an unstructured matrix plate 1; applying a negatively acting photoresist to the prepared unstructured matrix plate 1; drying the photoresist applied in order to provide a photoresist film 2; selectively exposing the photoresist film 2 by laser light; heating the selectively exposed photoresist film 2; developing the integrally exposed photoresist film 2, to remove the unexposed portions of the photoresist film 2 from surface portions of the matrix plate 1 and to provide a structured photoresist film 3 defined by the exposed portions; and heating the structured photoresist film 3. The photoresist film 3 and the matrix plate 1 collectively define a matrix comprising posts provided by the structure photoresist film 3 and lands provided by the surface portions of the matrix plate 1 from which the unexposed portions of the photoresist film 2 have been removed. The posts and lands of the matrix are arranged so that molding of optical disc storage media against the matrix causes the posts and lands of the matrix to respectively form complementary pits and lands in the optical disc storage media, the complementary pits and lands of the optical disc storage media representing stored data.

The preparation step of the unstructured matrix plate 1 comprises cleaning and possibly the application of a priming for the photoresist yet to be applied.

During the drying step the solvent in the photoresist is removed.

When preparing the unstructured matrix plate 1 stripes appeared to occur upon rinsing with MIBK. This problem could be solved by using ethyl acetate instead of MIBK.

By selectively exposing the negatively acting photoresist an acid is formed in the exposed areas.

By heating the negatively acting photoresist following said selective exposure the negatively acting photoresist is cross-linked in the exposed areas whilst the acid is catalyzed.

As a result of the integral exposure an acid is also formed in the nonexposed areas, the result of said acid being that the areas which have not been selectively exposed and which are thus not cross-linked are dissolved more quickly during the developing process.

As a result of the heating step following the developing process the exposed and thus cross-linked areas will be reinforced by further cross-linking of polymer chains.

In FIG. 2 the same steps are carried out as in FIG. 1, except that a metal film 4 is applied prior to the photoresist layer 2 and for the last heating step, which is replaced by a wet etching step and a photoresist removing step, and an unstructured matrix plate 1 is used, on which a metal film 4 is provided. For the rest the same reference numerals have been used. Numeral 7 indicates the structured metal film, but in principle this may also be a structured surface of the unstructured matrix plate.

Figure 3:
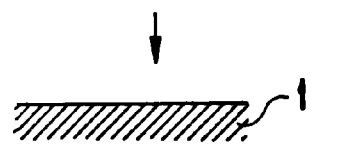
FIG. 3 schematically shows an embodiment of the proposed method, wherein a positively acting photoresist (filling process) is used.
Figure 3:
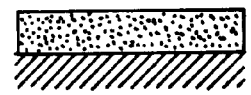
Figure 3:
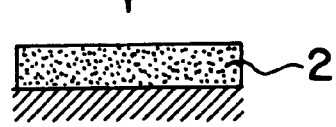
Figure 3:
Figure 3:
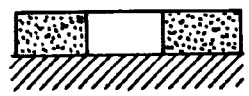
Figure 3:
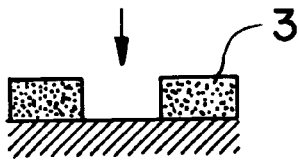
Figure 3:
Figure 3:
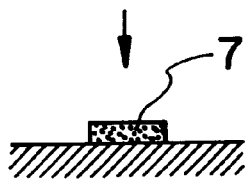

FIG. 3 illustrates the filling process. The steps up to and including the selectively exposing step and the developing step are analogous to the method of FIG. 1, of course with this difference that the structured photoresist film 3 of FIG. 3 has an inverted structure, because a positively acting photoresist is used instead of a negatively acting one. The steps following the developing step comprise the selective application of a metal 8, that is the filling step, and the removal of the structured photoresist 3. In FIG. 3 those parts corresponding with FIG. 1 have been given the same reference numerals, whilst the selectively applied metal film is indicated at 8.

The result of the method according to FIG. 1 is a matrix comprising photoresist posts 3, whilst the result of the methods according to FIGS. 2–3 is a matrix comprising metal posts 7. When the matrix according to FIG. 1 is ready, it may be provided with a thin metal film of for example chromium, nickel or aluminium, in order to extend the life of the matrix during the injection moulding process.

A common feature of the embodiments described with reference to the drawing is that a photoresist film 2 is applied to an unstructured matrix plate 1, and that the applied photoresist film 2 is structured. For handling purposes the unstructured matrix plate 1 may be placed on a substrate plate of for example glass (not shown) prior to applying the photoresist film 2. The structuring of the applied photoresist film 2 may take place in a photolithographic manner, whereby the applied photoresist film 2 is successively selectively exposed and developed. When a negatively acting photoresist is used to apply the photoresist film 2 to the unstructured matrix plate 1, it may be advantageous to heat the selectively exposed photoresist film 2 applied and/or integrally exposed said photoresist film 2 prior to developing, both measures being intended to obtain a thermally stable structured photoresist film 3. The use of a negatively acting photoresist makes it possible that the matrix is directly obtained by using the proposed method, as is described with reference to FIG. 1. In this case it is still preferred to heat the developed photoresist film 2 applied with a view to further thermally stabilizing the structured photoresist film 3. As an alternative, still using a negatively acting photoresist, the unstructured matrix plate 1 may be etched, using the structured photoresist film 3 applied thereto as a mask, whereupon the structured photoresist film 3 may be removed to produce the matrix, as is described with reference to FIG. 2. As is shown in FIG. 2, a metal film 4 may be applied to the unstructured matrix plate 1 prior to applying the photoresist film 2 to the unstructured matrix plate 1, in a thickness which is substantially equal to the height of the structure desired for the matrix. This may simplify the etching procedure. When a positively acting photoresist is used to apply the photoresist film 2 to the unstructured matrix plate 1, a common feature of the proposed method, an embodiment of which is described with reference to FIG. 3, that a metal film 8 is applied to the unstructured matrix plate 1, using the structured photoresist film 3 applied to the unstructured matrix plate 1 as a mask, and that subsequently the structured photoresist film 3 is removed to obtain the matrix. In accordance with the filling process shown in FIG. 3 the metal film 8 is then only applied to the unstructured matrix plate 1, in a thickness smaller than that of the structured photoresist film 3.

Now an embodiment of the proposed method in accordance with the embodiment shown in FIG. 1 will be described. AZ RAY-PRO (manufacturer: Hoechst) was used as the negatively acting photoresist. This photoresist was coated, by means of a spinning process, on to a blank nickel shell having a thickness of 300 μm, which was glued on to a standard 8 inch CD glass substrate by way of experiment. In an eventual process the shell may be attached to a flat carrier, such as a sole plate, by means of a vacuum. For a starting film thickness of 120 nm a solution of this photoresist and ethyl acetate as a diluent in a proportion of 10:1 was used in combination with a spinning speed of 700 RPM for 20 seconds.

After spin-drying the nickel shell/glass substrate assembly for 200 s at 1530 RPM this assembly, encased in a protective box, was heated in a recirculation oven at a constant temperature of 80° C. for 30 minutes, in order to dry the negatively acting photoresist film applied.

After cooling the assembly was exposed by means of a master registration system (MRS), which consisted of an EFM signal source and an 8 inch laser beam registration apparatus (LBR). The EFM modulated laser light having a wavelength of 459 nm was focused, with a numerical aperture of 0.45, on the nickel shell/glass substrate rotating at a tangential velocity of 1.4 m/s under the objective of the LBR, whereby a nominal writing capacity of about 4 mW was used.

Immediately after the exposing step the assembly and the protective box cover were placed horizontally in a free convection oven and heated at a temperature of 120° C. for 60 minutes.

After cooling in a cabinet with downward flow the assembly was placed in a light box specially arranged for that purpose, whereby integral exposure took place for 4 minutes. As a result of this the nonexposed parts of the negatively acting photoresist film provided on the nickel shell were exposed as yet.

After that the assembly was developed in an 8 inch developing system, whereby after rinsing with demineralized water for 15 s the assembly was developed in a diluted developing fluid solution at a rotational speed of 200 RPM, the proportion between developer and demineralized water being 1:2.5 thereby. The basic developer used was a buffer solution of sodium hydroxide and tetra sodium diphosphate. After a rinsing period of 15 s with demineralized water the assembly was spin-dried at 1530 RPM for 200 s.

Reheating and cooling took place in the same manner as after exposure, the only difference being the fact that the oven temperature set was 140° C.

Finally the nickel shell was separated from the glass substrate and processed, by means of conventional processing operations, such as polishing the rear side and cutting a central hole, into a standard 8 inch matrix to be placed in the mould of an injection moulding machine for mass-producing CD replicas.

Signal measurements carried out in combination with transmission order measurements on the CD replicas produced indicated that the bulge geometries on the matrix did not present any insurmountable problems with regard to the direct copying quality of the replicas.

From this and additional visual measurements, among which atomic force measurements (AFM), it appeared that the process parameters could be further optimized to enhance the quality of the matrix, among which the signal quality and durability under specific moulding conditions. Experiments carried out in this framework will be described hereafter.

A film thickness range of 120–180 nm was taken for the application of the negatively acting photoresist, whereby it appeared that the best results were obtained at a film thickness was 180 nm.

With regard to the heating temperature tests were taken within the range of 60–110° C. with a duration ranging from 20–40 minutes, whereby the best results were obtained when a temperature of 80° C. was used.

As far as the numerical aperture was concerned a range of 0.3–0.5 was used, whereby only a slight increase of the signal quality occurred when a high numerical aperture was selected.

The temperature range for heating following the exposing step was 85–125° C. with a duration of 25–60 min., whereby the temperature appeared to be critical and a temperature of 115° C. produced the best results.

For developing in diluted NaOH tests were taken in the time range of 30–50 s, whereby developing periods of 40–50 s were preferred.

For the temperature and time ranges used for the heating step following developing 120–160° C. and 15–45 minutes were used respectively, whereby temperatures from 160° C. within the said range and lower values within the said time range produced the best results.

The results were as follows:

| JITTER | 17 ns |
|---|---|
| XT | 18% |
| I1 | 4.5% |
| I2 | 45% |

When an experiment was carried out with the above optimum values within the selected ranges, but a temperature of 185° C. for heating following developing, it appeared that 2000 disks could be produced with the proposed matrix in the injection moulding machine, whereby the matrix did not exhibit any degradation whatever.

It is self-evident that the heating step may also be carried out in a different manner, for example by means of a so-called "hot plate".

For reproducibility reasons it may be necessary to develop to order. Compared with the developing step which is used when producing masters, the developing curve looks quite different now, because the lands are removed during the developing process of the proposed matrix. In the conventional process the transmission (zero and first orders) of the laser beam is measured, because the substrate is transparent, whilst with the proposed method the intensity of the light diffracted by reflection of the laser beam is measured, whereby the measured intensity of the diffracted light goes through a maximum in the first order. The stopping criterion for developing is formed by the decrease of the intensity of the diffracted light measured during developing by a certain percentage, for example 10–20%, with respect to the predetermined maximum. This also implies that instead of two diodes one diode is now used to measure the intensity, and that when more light is used for the writing step this does not mean that a shorter developing time is required, this in contrast to the conventional method, but that on the contrary a longer developing time is required. With the conventional process the stopping criterion is determined by the ratio between first order values and zero order values.

Remarkable is furthermore the fact that with regard to heating following developing it applies that a short time goes with a low temperature and that a long time goes with a high temperature. This is only a seeming contrast, which is based on the use of a negatively acting photoresist instead of a positively acting one.

Finally it is noted that the read-out in the matrix-playback equipment in case of a nickel matrix with plastic posts is different than in case of a matrix comprising a structured nickel matrix plate.

What is claimed is:

1. A method of manufacturing a matrix, said method comprising:

applying a negatively acting photoresist material to a matrix plate and thereafter drying the photoresist material to form a photoresist film;

selectively exposing the photoresist film to laser light to create unexposed portions and exposed portions of the photoresist film; and developing the photoresist film to remove the unexposed portions from surface portions of the matrix plate and to provide a structured photoresist film defined by the exposed portions, wherein the structured photoresist film and the matrix plate collectively define a matrix comprising posts provided by the exposed portions of the photoresist film and lands provided by the surface portions of the matrix plate from which the unexposed portions have been removed, the posts and lands of the matrix being arranged so that molding of optical disc storage media against the matrix causes the posts and lands of the matrix to respectively form complementary pits and lands in the optical disc storage media, the complementary pits and lands of the optical disc storage media representing stored data.

2. The method of claim 1, wherein said developing of the photoresist film comprises:

heating the unexposed and exposed portions of the photoresist film to induce partial crosslinking in the exposed portions, without inducing crosslinking in the unexposed portions, and thereby provide partially crosslinked portions as the exposed portions and non-crosslinked portions as the unexposed portions; and exposing the photoresist film to light and removing the non-crosslinked portions to provide the structured photoresist film.

3. The method of claim 2, further comprising heating the structured photoresist film to induce further crosslinking in the partially crosslinked portions.

4. The method of claim 1, further comprising diffracting light off said negatively acting photoresist film during said developing of the photoresist film to provide diffracted light having an intensity and terminating said developing of the photoresist film based on the intensity of the diffracted light.

5. The method of claim 4, further comprising measuring the intensity of the diffracted light and determining a maximum intensity level of the diffracted light, wherein said terminating of said developing of the photoresist film is conducted when the intensity of the diffracted light measured is a selected percentage below the maximum intensity level of the diffracted light.

6. The method of claim 1, further comprising plating the the posts and lands of the matrix with a metal film so that the metal film has a pattern corresponding to the structured photoresist film.

7. The method of claim 1, wherein the matrix plate has pregrooves.

8. A method of manufacturing a matrix, said method comprising:

preparing a matrix plate having a surface on which a metal coating is formed;

applying a negatively acting photoresist material to the metal coating and thereafter drying the photoresist material to form a photoresist film;

selectively exposing the photoresist film to laser light to create unexposed portions and exposed portions of the photoresist film;

developing the photoresist film to remove the unexposed portions from surface portions of the metal coating and to provide a structured photoresist film over masked portions of the metal coating;

selectively etching the surface portions of the metal coating from which the unexposed portions have been removed while retaining the masked portions of the metal coating; and removing the structured photoresist film from the masked portions of the metal coating to form a structured metal film, wherein the structured metal film and the matrix plate collectively define a matrix comprising posts provided by the structured metal film and lands provided by surface portions of the matrix plate from which the portions of the metal coating have been selectively etched, the posts and lands of the matrix being arranged so that molding of optical disc storage media against the matrix causes the posts and lands of the matrix to respectively form complementary pits and lands in the optical disc storage media, the complementary pits and lands of the optical disc storage media representing stored data.

9. The method of claim 8, wherein said developing of the photoresist film comprises:

heating the unexposed and exposed portions of the photoresist film to induce partial crosslinking in the exposed portions, without inducing crosslinking in the unexposed portions, and thereby provide partially crosslinked portions as the exposed portions and non-crosslinked portions as the unexposed portions; and exposing the photoresist film to light and removing the non-crosslinked portions to provide the structured photoresist film over the masked portions of the metal coating.

10. The method of claim 8, further comprising diffracting light off said negatively acting photoresist film during said developing of the photoresist film to provide diffracted light having an intensity and terminating said developing of the photoresist film based on the intensity of the diffracted light.

11. The method of claim 10, further comprising measuring the intensity of the diffracted light and determining a maximum intensity level of the diffracted light, wherein said terminating of said developing of the photoresist film is conducted when the intensity of the diffracted light measured is a selected percentage below the maximum intensity level of the diffracted light.

12. The method of claim 8, wherein the matrix plate has pregrooves.

13. A method of manufacturing a matrix, said method comprising:

applying a positively acting photoresist material to a matrix plate and thereafter drying the photoresist material to form a photoresist film;

selectively exposing the photoresist film to laser light to create unexposed portions and exposed portions of the photoresist film;

removing the exposed portions while retaining the unexposed portions and thereby forming structured gaps defined between the unexposed portions;

filling the structured gaps with a metal material to provide a structured metal film having a height less than that of the unexposed portions defining the structured gaps; and removing the unexposed portions, wherein the structured metal film and the matrix plate collectively define a matrix comprising posts provided by the structured metal film and lands provided by surface portions of the matrix plate from which the unexposed portions have been removed, the posts and lands of the matrix being arranged so that molding of optical disc storage media against the matrix causes the posts and lands of the matrix to respectively form complementary pits and lands in the optical disc storage media, the complementary pits and lands of the optical disc storage media representing stored data.

14. The method of claim 13, wherein the matrix plate has pregrooves.

15. A method of manufacturing optical disc storage media, which have pits and lands representing stored data, from a matrix, said method comprising:

applying a negatively acting photoresist material to a matrix plate and thereafter drying the photoresist material to form a photoresist film;

selectively exposing the photoresist film to laser light to create unexposed portions and exposed portions of the photoresist film;

developing the photoresist film to remove the unexposed portions from surface portions of the matrix plate and to provide a structured photoresist film defined by the exposed portions, the structured photoresist film and the matrix plate collectively defining a matrix comprising posts provided by the exposed portions of the photoresist film and lands provided by the surface portions of the matrix plate from which the unexposed portions have been removed; and molding optical disc storage media on the matrix so that the posts and lands of the matrix form complementary pits and lands in the optical disc storage media, the complementary pits and lands of the optical disc storage media representing stored data.

16. The method of claim 15, wherein said developing of the photoresist film comprises:

heating the unexposed and exposed portions of the photoresist film to induce partial crosslinking in the exposed portions, without inducing crosslinking in the unexposed portions, and thereby provide partially crosslinked portions as the exposed portions and non-crosslinked portions as the unexposed portions; and exposing the photoresist film to light and removing the non-crosslinked portions to provide the structured photoresist film.

17. The method of claim 16, further comprising heating the structured photoresist film to induce further crosslinking in the partially crosslinked portions.

18. The method of claim 15, further comprising diffracting light off said negatively acting photoresist film during said developing of the photoresist film to provide diffracted light having an intensity and terminating said developing of the photoresist film based on the intensity of the diffracted light.

19. The method of claim 18, further comprising measuring the intensity of the diffracted light and determining a maximum intensity level of the diffracted light, wherein said terminating of said developing of the photoresist film is conducted when the intensity of the diffracted light measured is a selected percentage below the maximum intensity level of the diffracted light.

20. The method of claim 15, further comprising plating the the posts and lands of the matrix with a metal film so that the metal film has a pattern corresponding to the structured photoresist film.

21. The method of claim 15, wherein the matrix plate has pregrooves.

22. A method of manufacturing optical disc storage media, which have pits and lands representing stored data, from a matrix, said method comprising:

preparing a matrix plate having a surface on which a metal coating is formed;

applying a negatively acting photoresist material to the metal coating and thereafter drying the photoresist material to form a photoresist film;

selectively exposing the photoresist film to laser light to create unexposed portions and exposed portions of the photoresist film;

developing the photoresist film to remove the unexposed portions from surface portions of the metal coating and to provide a structured photoresist film over masked portions of the metal coating;

selectively etching portions of the metal coating from which the unexposed portions have been removed while retaining the masked portions of the metal coating;

removing the structured photoresist film from the masked portions of the metal coating to form a structured metal film, the structured metal film and the matrix plate collectively defining a matrix comprising posts provided by the structured metal film and lands provided by surface portions of the matrix plate from which the portions of the metal coating have been selectively etched; and molding optical disc storage media on the matrix so that the posts and lands of the matrix respectively form complementary pits and lands in the optical disc storage media, the complementary pits and lands of the optical disc storage media representing stored data.

23. The method of claim 22, wherein said developing of the photoresist film comprises:

heating the unexposed and exposed portions of the photoresist film to induce partial crosslinking in the exposed portions, without inducing crosslinking in the unexposed portions, and thereby provide partially crosslinked portions as the exposed portions and non-crosslinked portions as the unexposed portions; and exposing the photoresist film to light and removing the non-crosslinked portions to provide the structured photoresist film over the masked portions of the metal coating.

24. The method of claim 22, further comprising diffracting light off said negatively acting photoresist film during said developing of the photoresist film to provide diffracted light having an intensity and terminating said developing of the photoresist film based on the intensity of the diffracted light.

25. The method of claim 24, further comprising measuring the intensity of the diffracted light and determining a maximum intensity level of the diffracted light, wherein said terminating said developing of the photoresist film is conducted when the intensity of the diffracted light measured is a selected percentage below the maximum intensity level of the diffracted light.

26. The method of claim 22, wherein the matrix plate has pregrooves.

27. A method of manufacturing optical disc storage media, which have pits and lands representing stored data, from a matrix, said method comprising:

applying a positively acting photoresist material to a matrix plate and thereafter drying the photoresist material to form a photoresist film;

selectively exposing the photoresist film to laser light to create unexposed portions and exposed portions of the photoresist film;

removing the exposed portions while retaining the unexposed portions and thereby forming structured gaps defined between the unexposed portions;

filling the structured gaps with a metal material to provide a structured metal film having a height less than that of the unexposed portions defining the structured gaps;

removing the unexposed portions, so that the structured metal film and the matrix plate collectively define a matrix comprising posts provided by the structured metal film and lands provided by surface portions of the matrix plate from which the unexposed portions have been removed; and molding optical disc storage media on the matrix so that the posts and lands of the matrix respectively form complementary pits and lands in the optical disc storage media, the complementary pits and lands of the optical disc storage media representing stored data.

28. The method of claim 27, wherein the matrix plate has pregrooves.

* * * * *